(12) United States Patent
Lee

(10) Patent No.: US 9,130,150 B2
(45) Date of Patent: Sep. 8, 2015

(54) SEMICONDUCTOR DEVICE AND FABRICATION METHOD THEREOF

(71) Applicant: SK hynix Inc., Gyeonggi-do (KR)

(72) Inventor: Hee Gyun Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 28 days.

(21) Appl. No.: 13/948,441

(22) Filed: Jul. 23, 2013

(65) Prior Publication Data

US 2014/0306287 A1 Oct. 16, 2014

(30) Foreign Application Priority Data

Apr. 12, 2013 (KR) ........................ 10-2013-0040577

(51) Int. Cl.
*H01L 27/12* (2006.01)
*H01L 45/00* (2006.01)
*H01L 27/24* (2006.01)

(52) U.S. Cl.
CPC ............ *H01L 45/06* (2013.01); *H01L 27/2436* (2013.01); *H01L 27/2463* (2013.01); *H01L 45/1233* (2013.01); *H01L 45/1683* (2013.01)

(58) Field of Classification Search
CPC ... H01L 29/785; H01L 29/78; H01L 29/4175; H01L 29/41758; H01L 29/7841; H01L 29/4238; H01L 27/10876; H01L 27/10802; H01L 27/10826; H01L 27/10879; H01L 27/1203; H01L 21/84; H01L 27/2436; H01L 27/2463; H01L 45/06; H01L 45/1683; H01L 45/1233

See application file for complete search history.

(56) References Cited

U.S. PATENT DOCUMENTS

2007/0051994 A1* 3/2007 Song et al. .................... 257/296

FOREIGN PATENT DOCUMENTS

KR 1020130104527 9/2013

* cited by examiner

*Primary Examiner* — Victor A Mandala
(74) *Attorney, Agent, or Firm* — IP & T Group LLP

(57) ABSTRACT

A semiconductor device and a fabrication method thereof are provided. The semiconductor device includes a local silicon-on-insulator (SOI) substrate in which a portion of a line-shaped active region is connected to a semiconductor substrate, and a remaining portion thereof is insulated from the semiconductor substrate, gate structures formed in a line shape to be substantially perpendicular to the active region on the active region insulated from the semiconductor substrate, and to surround a side and an upper surface of the active region, and having a stacking structure of a gate insulating layer, a liner conductive layer, a gate conductive layer, and a hard mask layer, a source region formed in the active region connected to the semiconductor substrate, and a drain region formed in the active region insulated from the semiconductor substrate between the gate structures.

12 Claims, 7 Drawing Sheets

SEMICONDUCTOR DEVICE AND FABRICATION METHOD THEREOF

CROSS-REFERENCES TO RELATED APPLICATION

The present application claims priority under 35 U.S.C. 119(a) to Korean application number 10-2013-0040577, filed on Apr. 12, 2013, in the Korean Intellectual Property Office, which is incorporated herein by reference in its entirety.

BACKGROUND

1. Technical Field

Exemplary embodiments of the present invention relate to an integrated circuit device, and more particularly, to a semiconductor device and a fabrication method thereof.

2. Related Art

Semiconductor devices need to be more highly integrated, and various studies on the semiconductor devices with high integration and high density have been made.

Even in the phase-change random access memory devices (PCRAMs) that have received attention as memory devices for replacing flash memories, the first priority is to improve integration density. Thus, studies on reduction in a chip area have been increasingly made. However, there are limits to reduce a minimum feature size due to limitation of a light source.

To overcome the limits, a method of fabricating a three-dimensional (3D) PCRAM by fabricating a switching diode in a vertical pillar shape or fabricating a switching transistor using a vertical pillar and a vertical gate, is suggested. However, there are difficulties in fabricating the vertical pillar of the 3D PCRAM. In particular, a height of the vertical pillar needs to be increased to improve off current characteristics of a switching diode using the vertical pillar. However, an aspect ratio is increased due to the increase in the height of the vertical pillar, which creates difficulties in the process and causes diode leaning. Further, the height of the vertical pillar needs to be increased to ensure an effective channel length even in a switching transistor using the vertical pillar. In the switching transistor, similar to the switching diode described above, an aspect ratio is also increased due to the increase in the height of the vertical pillar, which creates difficulties in the process and causes leaning.

A switching device having a horizontal channel structure is suggested to overcome the limits of the vertical switching device, FIGS. 1 and 2A to 2C are views illustrating a structure of a general switching device having a horizontal channel structure.

FIG. 1 is a perspective view of a part of a general switching device 10 having a horizontal channel structure. FIG. 2A is a side view of the part shown in FIG. 1 when viewed in an X-direction. FIG. 2B is a cross-sectional view of the part taken along line X11-X12 of FIG. 1. FIG. 2C is a side view of the part shown in FIG. 1 when viewed in a Y-direction.

An active region 105 is formed on a semiconductor substrate 101 in which a common source region (not shown) is formed. The active region 105 may be a line pattern extending to a first direction. A predetermined portion of the active region 105 is connected to the semiconductor substrate 101, and a remaining portion of the active region 105 is insulated from the semiconductor substrate 101 by an insulating layer 103. The remaining portion of the active region 105 disposed on the insulating layer 103 serves as a drain region D, and the predetermined portion of the active region 105 connected to the common source region serves as a source region S.

A gate structure 107, extending to a second direction perpendicular to the first direction and surrounding a side and an upper surface of the active region 105, is formed on the active region 105. The gate structures 107 having a line shape are formed on the drain region D in a predetermined interval. A spacer 109 is formed on the source region S between the gate structures 107 and on sidewalls of the gate structures 107. A space between the gate structures 107 is buried with an interlayer insulating layer 111.

In the switching device 107 having the horizontal channel structure, the gate structure 107 is formed to have a stacking structure of a gate insulating layer 1071, a gate conductive layer 1073, a barrier metal layer 1075, and a hard mask layer 1077. The gate conductive layer 1073 may be a polysilicon layer doped with impurities, the barrier metal layer 1075 may be a tungsten (W) layer, and the hard mask layer 1077 may be a silicon nitride layer.

That is, in the general switching device having the horizontal channel structure, a gate electrode (a word line) is formed of a polysilicon layer and a W layer. A height of the gate structure 107 is increased by the gate electrode, and thus an aspect ratio increases accordingly. The increase in the aspect ratio causes leaning during an etching and cleaning process for gate formation, and the gate structure may be collapsed. Therefore, fabrication yield may be reduced.

SUMMARY

According to one aspect of an exemplary embodiment of the present invention, a semiconductor device may include a local silicon-on-insulator (SOI) substrate in which a portion of a line-shaped active region is connected to a semiconductor substrate, and a remaining portion thereof is insulated from the semiconductor substrate, gate structures formed in a line shape to be substantially perpendicular to the active region on the active region insulated from the semiconductor substrate, and to surround a side and an upper surface of the active region, and having a stacking structure of a gate insulating layer, a liner conductive layer, a gate conductive layer, and a hard mask layer, a source region formed in the active region connected to the semiconductor substrate, and a drain region formed in the active region insulated from the semiconductor substrate between the gate structures.

According to another aspect of an exemplary embodiment of the present invention, a method may include providing a local silicon-on-insulator (SOI) substrate in which a portion of a line-shaped active region is connected to a semiconductor substrate, and a remaining portion thereof is insulated from the semiconductor substrate, forming gate structures on the remaining portion by sequentially forming a gate insulating layer, a liner conductive layer, a gate conductive layer, and a hard mask layer on an entire surface of the local SOI substrate, and patterning the layers to a direction substantially perpendicular to the active region, wherein the liner conductive layer is a titanium nitride layer and forming a spacer on the active region between the gate structures and on facing sidewalls of the gate structures, and implanting impurities into the active region between the gate structures.

These and other features, aspects, and embodiments of the present invention are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
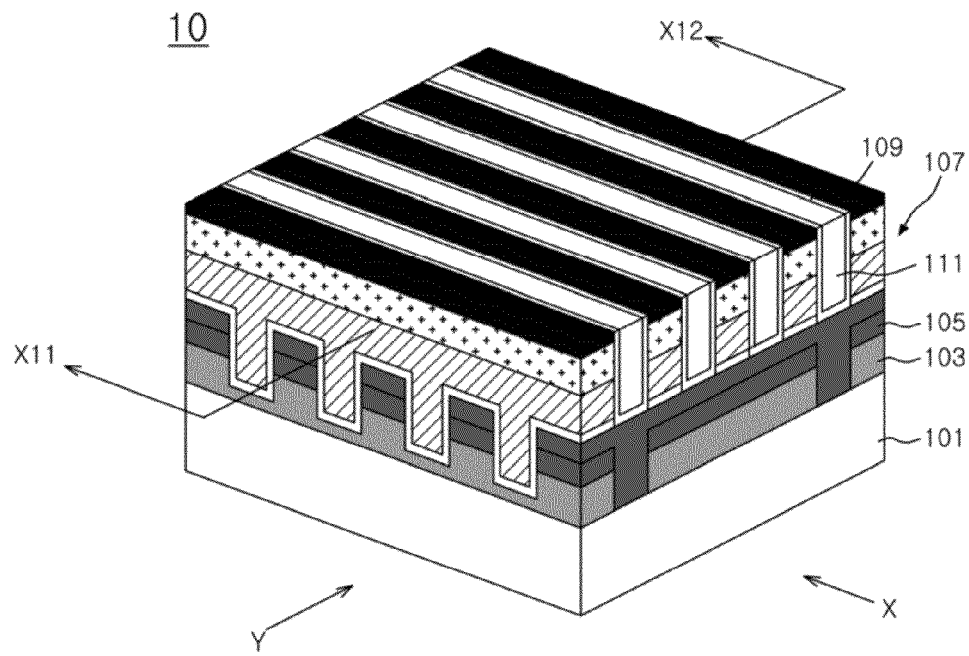
FIGS. 1 and 2A to 2C are views illustrating a structure of a general switching device having a horizontal channel structure.
Figure 2A:
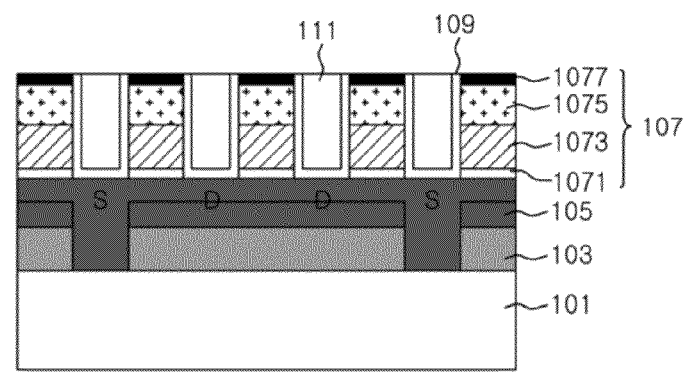
Figure 2B:
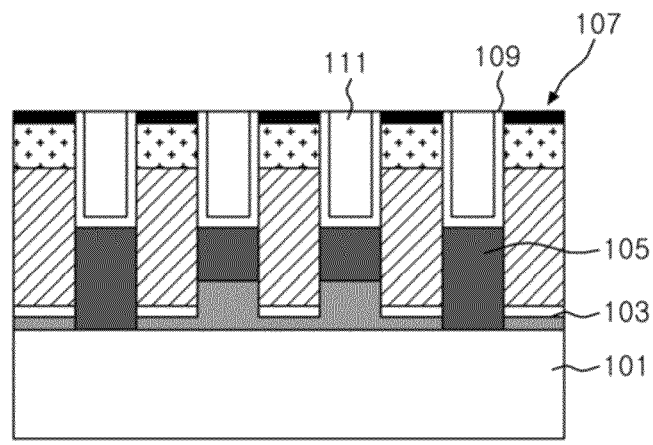
Figure 2C:
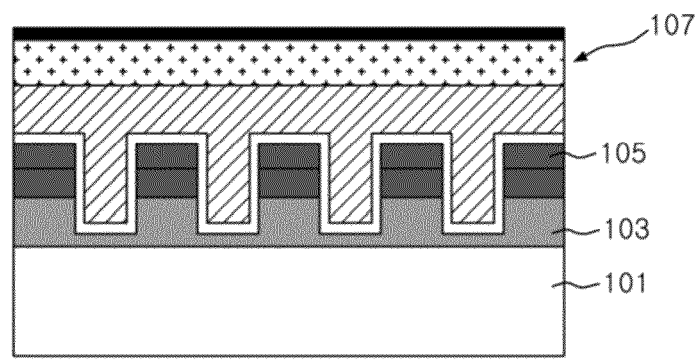

Hereinafter, exemplary embodiments of the present invention will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. These embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

In the drawings, lengths and sizes of layers and regions may be exaggerated for clarity. It should be readily understood that the meaning of "on" and "over" in the present disclosure should be interpreted in the broadest manner such that on means not only "directly on" but also "on" something with an intermediate feature(s) or a layer(s) therebetween, and that "over" means not only directly on top but also on top of something with an intermediate feature(s) or a layer(s) therebetween. It is also noted that in this specification, "connected/coupled" refers to one component not only directly coupling another component but also indirectly coupling another component through an intermediate component. In addition, a singular form may include a plural form as long as it is not specifically mentioned in a sentence.

FIGS. 3 and 4A to 4C are views illustrating a structure of a switching device having a horizontal channel structure according to an exemplary embodiment of the present invention.

Figure 3:
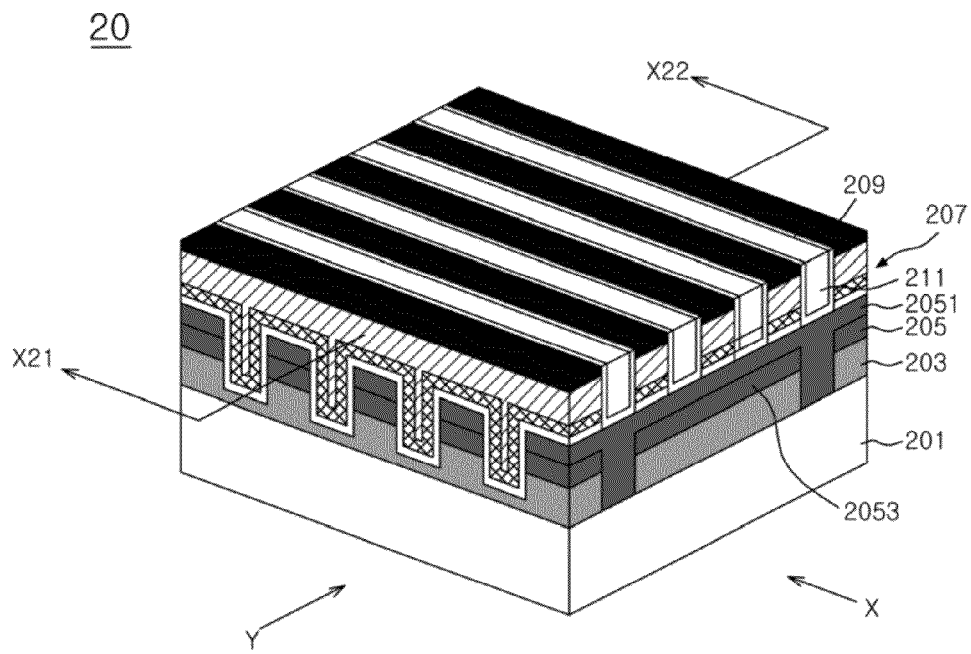
FIGS. 3 and 4A to 4C are views illustrating a structure of a switching device having a horizontal channel structure according to an exemplary implementation of the inventive concept.
Figure 4A:
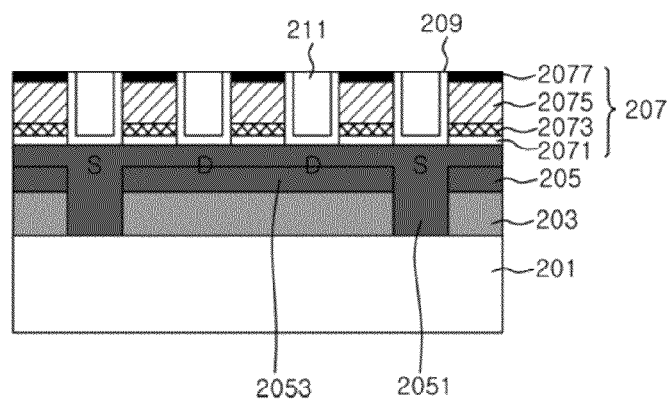
Figure 4B:
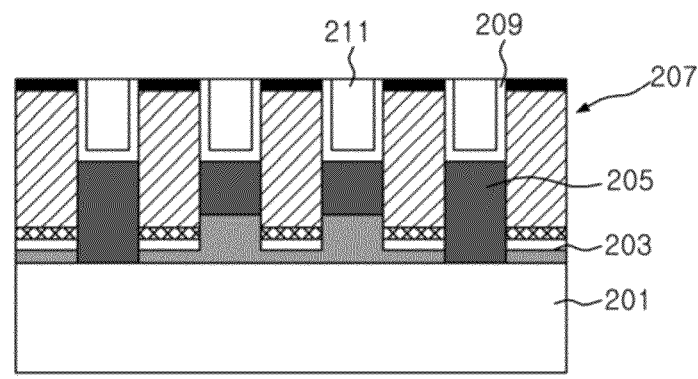
Figure 4C:
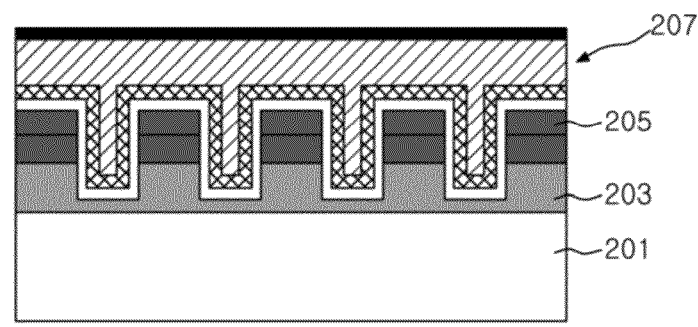

FIG. 3 is a perspective view of a part of a switching device having a horizontal channel structure according to an exemplary implementation of the inventive concept. FIG. 4A is a side view of the part shown in FIG. 3 when viewed in an X-direction. FIG. 4B is a cross-sectional view of the part taken along line X21-X22 of FIG. 3. FIG. 4C is a side view of the part shown in FIG. 3 when viewed in a Y-direction.

Referring to FIGS. 3 and 4A to 4C, a switching device 20 according to an exemplary embodiment of the present invention may include a semiconductor substrate 201, an active region 205, a gate structure 207, a source region S, and a drain region D.

More specifically, the active region 205 is formed to a line shape extending to a first direction on the semiconductor substrate 201. The active region 205 is connected to the semiconductor substrate 201 through a connection portion 2051 of the active region 205. A floating region 2053 of the active region 205 other than the connection portion 2051 of the active region 205 is insulated from the semiconductor substrate 201 by an insulating layer 203.

The source region S may be formed in the connection portion 2051 of the active region 205, and the drain region D may be formed in the floating region 2053 of the active region 205.

The gate structure 207 is formed in a line shape extending to a second direction perpendicular to the first direction on the active region 205, and formed to surround a side and an upper surface of the active region 205. In the exemplary embodiment, the gate structure 207 may be formed on the drain region D.

A spacer 209 is formed on the source region between the gate structures 207. A space between the gate structures 207 is buried with an interlayer insulating layer 211.

Although not shown, a common source region may be formed to a predetermined depth in the semiconductor substrate 201, and the common source region may be connected to the source region S.

The gate structure 207 may have a stacking structure of a gate insulating layer 2071, a liner conductive layer 2073, a gate conductive layer 2075, and a hard mask layer 2077.

Here, the liner conductive layer 2073 may be formed of a titanium nitride (TiN) layer. TiN may be a thinner layer than that of W, and has a lower resistivity than W. It is well known that TiN has high tensile stress after a deposition process.

When the TiN layer is applied as a barrier metal layer instead of W layer, an operation current may be reduced while a height of the gate structure 207 may be considerably reduced.

Further, as shown in FIGS. 3 and 4A to 4C, since the liner conductive layer 2073 is formed between the gate insulating layer 2071 and the gate conductive layer 2075, the high tensile stress of TiN is transferred to the source region S and the drain region D. The high tensile stress causes the band gap to be narrow, and cause electron-hole pairs to be generated rapidly. Therefore, channel mobility is increased and operation characteristics of a switching transistor may be improved.

FIGS. 5A to 5I are cross-sectional views illustrating a method of fabricating a switching device having a horizontal channel structure according to an exemplary implementation of the inventive concept.

Figure 5A:
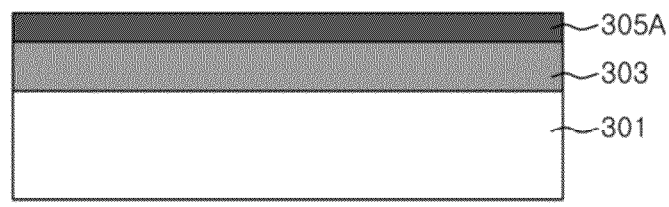
FIGS. 5A to 5I are cross-sectional views illustrating a method of fabricating a switching device having a horizontal channel structure according to an exemplary implementation of the inventive concept.

First, referring to FIG. 5A, a sacrificial layer 303 and a first semiconductor layer 305A are sequentially formed on a semiconductor substrate 301.

The semiconductor substrate 301 may be a silicon substrate formed through an epitaxial growth method. The sacrificial layer 303 and the first semiconductor layer 305A may include semiconductor material layers having different etch selectivities from each other. For example, the sacrificial layer 303 may be formed using silicon germanium (SiGe), and the first semiconductor layer 305A may be formed using silicon (Si). The sacrificial layer 303 and the first semiconductor layer 305A may be formed using an epitaxial growth method to have a perfect crystalline state.

A common source region may be formed to a predetermined depth in the semiconductor device 301, but the present invention is not limited thereto. The common source region may be formed in a process of forming a source region and a drain region to be described later.

Figure 5B:
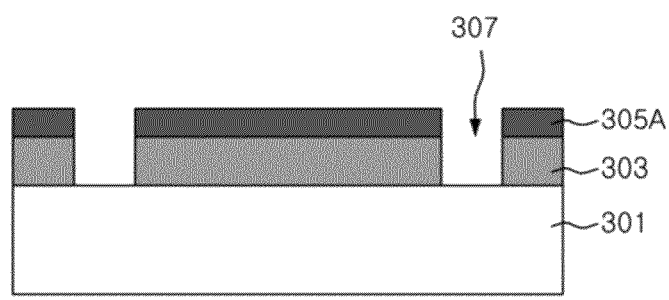

Referring to FIG. 5B, a photoresist pattern (not shown) is formed to expose a predetermined region of the first semiconductor layer 305A, preferably, to expose a source formation region. The first semiconductor layer 305A and the sacrificial layer 303 are patterned to form a hole 307 exposing a surface of the semiconductor substrate 301.

Figure 5C:
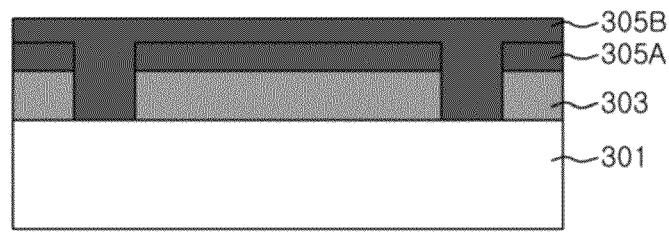

After the hole 307 is formed, a native oxide layer is removed, and a heat treatment is performed in a predetermined temperature and in a hydrogen atmosphere. As illustrated in FIG. 5C, the first semiconductor layer 305A fills the hole 307, and forms a second semiconductor layer 305B.

Figure 5D:
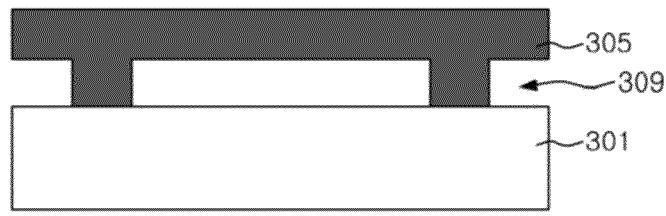

As illustrated in FIG. 5D, the second semiconductor layer 305B, the first semiconductor layer 305A, and the sacrificial layer 303 are patterned in a line shape to a first direction perpendicular to a formation direction of a gate line (that is, a word line) to be formed later, and the active region 305 including the first and second semiconductor layers 305A, 305B is defined. The sacrificial layer 303 is removed along an exposed portion of a side of the active region 305 patterned in the line shape. A space left after the sacrificial layer 303 is removed is indicated by the reference numeral 309 in FIG. 5D.

Figure 5E:
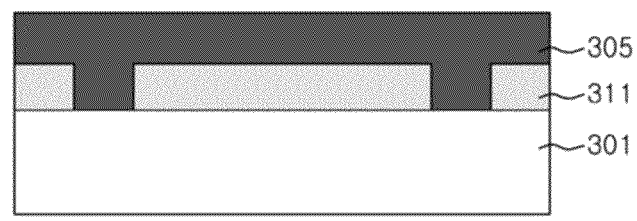

Referring to FIG. 5E, an insulating layer 311 is formed on the semiconductor substrate 201 including the space 309. The insulating layer 311 may include an insulating layer having good gap fill characteristic to fill the space 309. Therefore, the insulating layer 311 may fill the space 309, and be partially filled in a space between the active regions 305. The insulating layer 311 is also recessed so that the insulating layer remains on the surface of the semiconductor substrate 301 in the space between the active regions 305. Therefore, a local SOI structure, in which the insulating layer 311 is interposed between the semiconductor substrate 301 and the active region 305, is formed.

A word line is formed after the local SOI structure is formed.

Figure 5F:
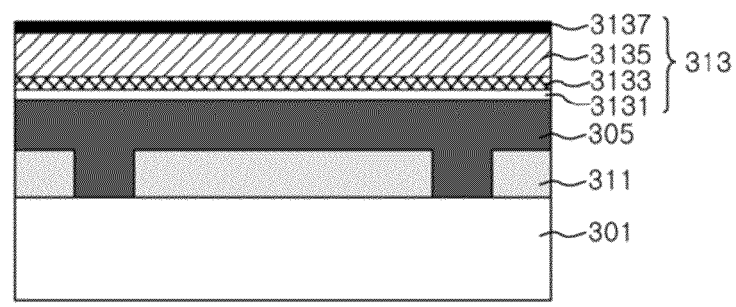

As illustrated in FIG. 5F, a gate insulating layer 3131 is formed on the SOI structure illustrated in FIG. 5E, and a TiN layer 3133, a gate conductive layer 3135, and a hard mask layer 3137 are sequentially formed on the SOI structure including the gate insulating layer 3131. The gate insulating layer 3131, the TiN layer 3133, the gate conductive layer 3135, and the hard mask layer 3137 are patterned to a second direction perpendicular to the active region 305 to form a gate structure 313, that is, the word line.

In an exemplary embodiment, the TiN layer 3133 may be formed to have a thickness similar to the gate insulating layer 3131. The gate conductive layer 3135 may be a polysilicon layer doped with impurities, and the hard mask layer 3137 may be a silicon nitride layer.

Figure 5G:
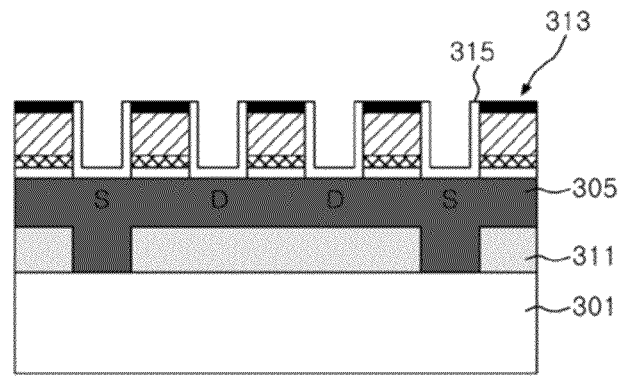

As illustrated in FIG. 5G, a spacer 315 is formed on the active region 305 between the gate structures 313. A mask (not shown) is formed on the gate structure 313, and a source region S and a drain region D are formed by implanting impurities into the active region at both sides of the gate structure 313. In the process of forming the source region S and the drain region D, a common source region may be formed. Therefore, the source region S is connected to the common source region, and the drain region D is formed on the active region 305 over the insulating layer 311.

Figure 5H:
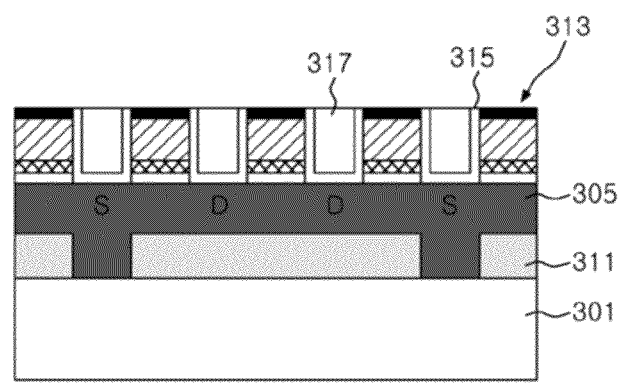

As illustrated in FIG. 5H, an interlayer insulating layer 317 is buried in the space between the gate structures 313, and then planarized to expose upper surfaces of the gate structures 313.

Figure 5I:
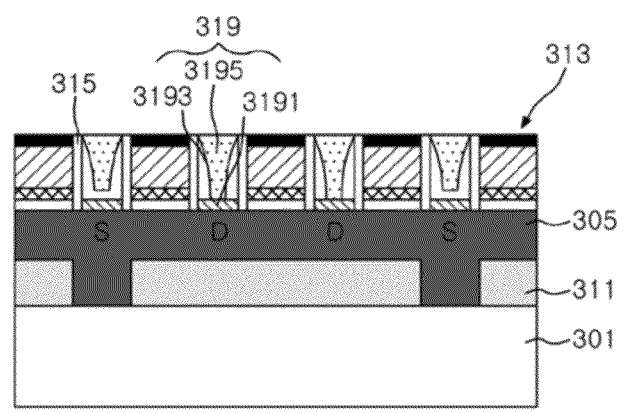

As illustrated in FIG. 5I, a process of forming a memory cell 319 may be performed.

The memory cell 319 may be, for example, a PCRAM cell, and an example for a fabrication method thereof will be described.

A photoresist pattern (not shown) is formed on the SOI structure illustrated in FIG. 5H to expose an upper surface of the interlayer insulating layer 317, and the exposed interlayer insulating layer 317 is removed. The spacer 315 is anisotropically etched so that the spacer 315 remains on the sidewalls of the gate structure 313. Therefore, the source region S and the drain region D are exposed.

A lower electrode 3191 is formed on the exposed source region S and drain region D. The lower electrode 3191 may be formed by forming a conductive layer on the SOI structure including the spacer 315 and recessing the conductive layer. Therefore, the lower electrode 3191 remains on a bottom of the space between the gate structures 313.

After the lower electrode 3191 is formed, an insulating layer 3193 for a spacer is formed on the lower electrode 3191. A photoresist pattern (not shown) is formed on the insulating layer 3193 for a spacer over the source region S to expose the insulating layer 3193 for a spacer on the drain region D. The insulating layer 3193 for a spacer on the drain region D is anisotropically etched to expose the lower electrode 3191 on the drain region D.

Next, the photoresist pattern formed on the insulating layer 3193 for a spacer over the source region S is removed, and a phase-change material layer 3195 is buried and planarized to form the PCRAM cell 319.

As described above in the semiconductor device according to an exemplary embodiment, a barrier conductive layer is formed by using a TiN layer capable of being thinly formed instead of W layer. Therefore, the aspect ratio of the gate structure may be reduced and the semiconductor device may be stably fabricated. Further, by the high tensile stress of the TiN layer, the electron-hole pairs are fast generated, channel mobility may increase, and the band gap may become narrow. Therefore, switching characteristics may be considerably improved.

Further, in the memory device using the semiconductor device as a switching device, the integration density may be increased and a size may be minimized.

The above embodiments of the present invention are illustrative, and the invention is not limited by the embodiments described above. Various alternatives and equivalents are possible, and the invention is not limited to any specific type of semiconductor device. Other additions, subtractions, or modifications may be made in view of the present disclosure and are intended to fall within the scope of the following claims.

What is claimed is:

1. A semiconductor device, comprising:
    a local silicon-on-insulator (SOI) substrate in which a portion of a line-shaped active region is connected to a semiconductor substrate, and a remaining portion thereof is insulated from the semiconductor substrate;
    gate structures formed in a line shape to be substantially perpendicular to the active region on the active region insulated from the semiconductor substrate, and to surround outer sidewalls and an upper surface of the active region, and having a stacking structure of a gate insulating layer, a liner conductive layer, a gate conductive layer, and a hard mask layer;
    a source region formed in the active region connected to the semiconductor substrate; and
    a drain region formed in the active region insulated from the semiconductor substrate between the gate structures,
    wherein the gate insulating layer is formed along on the upper surface and the outer sidewalls of the active region, and a bottom of a space between adjacent active regions;

the liner conductive layer is formed on the gate insulating layer along over the upper surface and the outer sidewalls of the active region, and the bottom of the space between adjacent active regions: and the gate conductive layer is formed on the liner conductive layer so as to fill the space between adjacent active regions.

2. The semiconductor device of claim 1, wherein the liner conductive layer is a titanium nitride layer.

3. The semiconductor device of claim 1, wherein the local SOI substrate includes the active region patterned in the line shape to a first direction on the semiconductor substrate, wherein the active region includes a connection portion extending toward the semiconductor substrate and electrically connecting the semiconductor substrate and the active region, and a floating region that is a region other than the connection portion and is insulated from the semiconductor substrate.

4. The semiconductor device of claim 3, further comprising an insulating layer interposed between the floating region and the semiconductor substrate.

5. The semiconductor device of claim 1, further comprising:

a spacer formed on the source region between the gate structures; and an interlayer insulating layer filling a space between the gate structures.

6. The semiconductor device of claim 1, wherein the semiconductor substrate further includes a common source region electrically connected to the source region.

7. A semiconductor device, comprising:

a local silicon-on-insulator (SOI) substrate including a semiconductor substrate and an active region over the semiconductor substrate, wherein the active region includes a connection portion connected to the semiconductor substrate and a floating portion insulated from the semiconductor substrate;

gate structures faulted to surround a side and an upper surface of the floating portion, wherein each of the gate structures includes a stacking structure in which a gate insulating layer, a liner conductive layer, a gate conductive layer and a hard mask layer are sequentially stacked, wherein the liner conductive layer is a titanium nitride layer;

a source region formed in the connection portion; and a drain region formed in the floating portion between the gate structures.

8. The semiconductor device of claim 7, wherein the active region is patterned in a line shape to a first direction, and each of gate structures is patterned in a line shape to a second direction perpendicular to the first direction.

9. The semiconductor device of claim 7, wherein the connection portion extends to the semiconductor substrate.

10. The semiconductor device of claim 7, further comprising:

an insulating layer interposed between the floating region and the semiconductor substrate.

11. The semiconductor device of claim 7, further comprising:

a spacer formed on the source region between the gate structures and on facing sidewalls of the gate structure; and an interlayer insulating layer filling a space between the gate structures.

12. The semiconductor device of claim 7, further comprising:

a common source region formed in the semiconductor substrate and electrically connected to the source region.

* * * * *